United States Patent [19]
Schmidt et al.

[11] Patent Number: 6,162,996
[45] Date of Patent: *Dec. 19, 2000

[54] INSULATING FOIL CIRCUIT BOARD WITH RIGID AND FLEXIBLE SECTIONS

[75] Inventors: Walter Schmidt, Zürich; Marco Martinelli, Neftenbach, both of Switzerland

[73] Assignee: Dyconex Patente AG, Zug, Switzerland

[*] Notice: This patent issued on a continued prosecution application filed under 37 CFR 1.53(d), and is subject to the twenty year patent term provisions of 35 U.S.C. 154(a)(2).

[21] Appl. No.: 08/556,921

[22] PCT Filed: Mar. 23, 1994

[86] PCT No.: PCT/CH94/00062

§ 371 Date: Nov. 21, 1995

§ 102(e) Date: Nov. 21, 1995

[87] PCT Pub. No.: WO95/26122

PCT Pub. Date: Sep. 28, 1995

[51] Int. Cl.$^7$ .......................................... H05K 1/02
[52] U.S. Cl. .............................. 174/259; 174/254; 216/17; 216/20
[58] Field of Search .................... 174/254, 255, 174/259; 361/749, 792–795, 750; 216/13, 17, 20

[56] References Cited

U.S. PATENT DOCUMENTS

| | | | |
|---|---|---|---|
| 3,589,004 | 6/1971 | Shaheen | 29/625 |
| 4,931,134 | 6/1990 | Hatkevitz et al. | 156/630 |
| 5,004,639 | 4/1991 | Desai | 428/138 |
| 5,288,542 | 2/1994 | Cibulsky | 428/209 |
| 5,347,712 | 9/1994 | Yasuda et al. | 29/852 |
| 5,499,444 | 3/1996 | Doane, Jr. et al. | 29/830 |

FOREIGN PATENT DOCUMENTS

| | | |
|---|---|---|
| 534 290 | 3/1993 | European Pat. Off. . |
| 575 292 | 12/1993 | European Pat. Off. . |
| 3302857 A1 | 8/1984 | Germany . |
| 42 49 026 | 3/1993 | Germany . |
| WO 93/26143 | 12/1993 | WIPO . |

*Primary Examiner*—Jeffrey Gaffin
*Assistant Examiner*—Kamand Cuneo
*Attorney, Agent, or Firm*—Pearne & Gordon LLP

[57] ABSTRACT

The multilayer foil circuit board according to the invention has rigid (s) and flexible (f) areas and in the rigid areas has more foil layers than in the flexible areas. The foil circuit board according to the invention is produced so that in the intended flexible areas (f) at least on one side at least the outermost foil layer (1.2) is removed by etching. By a corresponding etching mask design, it is possible to allow the flexible areas (f) to pass continuously into the rigid areas (s) in that the removal of the layers in the marginal areas (u) is less than in the center (z) of the flexible area (f), so that there are no marginal areas which have a tendency to break. The etching of the flexible areas can be performed in the same method stage as the etching of the plated through holes through the corresponding foil layer (1.2) or in a separate etching stage.

4 Claims, 4 Drawing Sheets

INSULATING FOIL CIRCUIT BOARD WITH RIGID AND FLEXIBLE SECTIONS

FIELD OF THE INVENTION

The invention is in the field of printed circuit boards and relates to a foil circuit board.

BACKGROUND OF THE INVENTION

According to a foil technology, such as is e.g. described in the international patent application with the publication number WO 93/26143 of the same applicants, thin circuit boards are produced from foils or films of an electrically insulating material (e.g. polyimide or epoxy resin) coated on one or both sides with e.g. copper. The production of these foil circuit boards essentially comprises producing conductors and plated through holes on a foil coated on both sides using known photographic and chemical/physical methods. A circuit board obtained in this way with an insulating foil layer and two conductor layers can be laminated together on one or both sides with a further insulating foil (coated on one side with metal) with the aid of in each case an adhesive coating. The further insulating foil or foils are then once again provided with conductors and plated through holes. These method steps can be repeated any number of times, so that foil circuit boards are obtained comprising a plurality of insulating foil layers and a plurality of conductor layers.

As such foil circuit boards are very thin and particularly if they only comprise a few insulating foil layers are also flexible, prior to assembly they are normally laminated onto a rigid substrate, which leads to circuit boards which correspond as regards thickness and format to the normal standards.

If foil circuit boards are built up from several insulating foil layers., their flexibility very significantly decreases, so that in this way, ever without a substrate, very thin circuit boards can be produced which have an adequate natural rigidity, as compared with standard circuit boards, for assembly purposes. Such circuit boards are e.g. used for multichip modules.

As not only the electronic components and the circuit boards assembled therewith are becoming increasingly smaller, but also the equipment and apparatus in which such circuit boards are installed, it would be advantageous in many cases if the circuit boards could be housed in the equipment in such a way as to save more space, i.e. if they could be adapted in an optimum manner, particularly in a flexible or bendable manner with respect to the equipment shape or at least the shape of the equipment inner space allocated thereto. However, it is still necessary for the assembly of circuit boards, to prevent, by adequate rigidity of the circuit board, stresses in the connections between the electronic components and conductors on the circuit board which can be caused by circuit board deformations.

SUMMARY OF THE INVENTION

An object of the invention is to provide insulating foil circuit boards, which satisfy both conditions, namely the flexibility or bendability conditions enabling the adaptability thereof to the environment and the rigidity condition for the assembly thereof.

The central idea of the invention is based on the fact that insulating foil circuit boards are created, which are zonally flexible and zonally rigid, in that in the flexible areas compared with the rigid areas one or more outer insulating foil layers are interrupted or have a reduced thickness, in such a way that a flexible area is overall thinner than a rigid area. The insulating foil circuit boards according to the invention are produced in that in an etching stage, preferably a plasma etching stage, on one or both sides the outermost insulating foil layers of the resulting circuit board are removed in larger-surface manner at the points where there are flexible areas. This etching stage can be performed on the last laminated-on insulating foil layer or layers or can be repeated for further laminated-on insulating foil layers. The method is particularly advantageous if, in the same etching stage, the openings necessary for the plated through holes are produced in the corresponding insulating foil layer.

This leads to insulating foil circuit boards having rigid and flexible areas. Through a corresponding design of the transition between the rigid and flexible areas this can be made quasi-continuous, which e.g. prevents an area made flexible for bending purposes breaking at the transition to the rigid area. The thickness difference or the difference in the number of insulating foil layers between rigid and flexible areas is of a random nature and will be adapted as a function of the complexity of the electronic circuit (number of insulating foil layers in the rigid area) and the desired flexibility (number of insulating foil layers in the flexible area). The flexible area has at least one insulating foil layer and the rigid area at least two. For increasing their natural rigidity, the rigid areas can also be drawn onto a rigid substrate.

The layout of the printed circuit board according to the invention is obviously such that the rigid areas are assembled, whereas there are only interconnecting conductors in the flexible areas.

As has already been mentioned, insulating foil circuit boards with rigid and flexible areas can be used where there are difficult space conditions. However, it is also possible to equip e.g. multichip modules with flexible marginal areas, which can then be used for connection to a rigid circuit board.

BRIEF DESCRIPTION OF THE DRAWINGS

Embodiments of insulating foil circuit boards according to the invention and the method for the production thereof are described in greater detail hereinafter with reference to the attached drawings, wherein.

DESCRIPTION OF PREFERRED EMBODIMENTS

Figure 1:
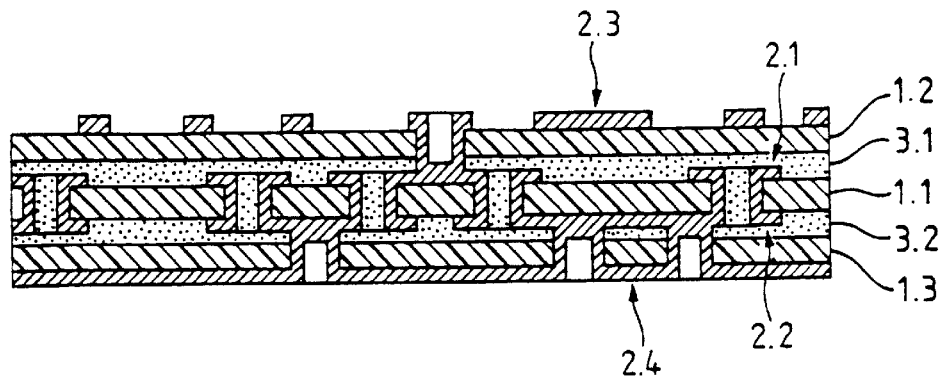
FIG. 1 is a sectional side elevation of a insulating foil circuit board with three foil layers and four conductor layers produced according to the aforementioned method.

FIG. 1 shows a cross-section through an area of a foil circuit board, it, together with its production, being described in the aforementioned international publication (WO 93/26143). The circuit board comprises a central film or insulating foil layer (plastic film) 1.1, the plated-through holes and a two-sided pattern of conductors 2.1 and 2.2. On both sides by means of adhesive coatings 3.1 and 3.2 a further non-conductive foil layer 1.2 and 1.3 is in each case laminated onto the central insulating foil layer 1.1. The further foil layer once again has plated-through holes and a pattern of conductors 2.3 and 2.4. These outer plated-through holes are produced in the laminated-on insulating foil coated with a thin metal coating, in that with photo-chemical means the metal coating is etched away at the corresponding points and then the plastic film is etched through by plasma etching. The metallic coating is then e.g. built up by electroplating to a thickness suitable for the conductors and the openings are simultaneously plated through. The pattern of the conductors is etched photo-chemically into the metal coating produced in this way.

FIGS. 2a to 2c once again show as a cross-section through an area of an embodiment of the circuit board according to the invention in the three stages of its production. As in FIG. 1, it is a foil circuit board with three non-conductive foil layers and four conductor layers, on which a flexible area f is provided between two rigid areas s.

Figure 2A:
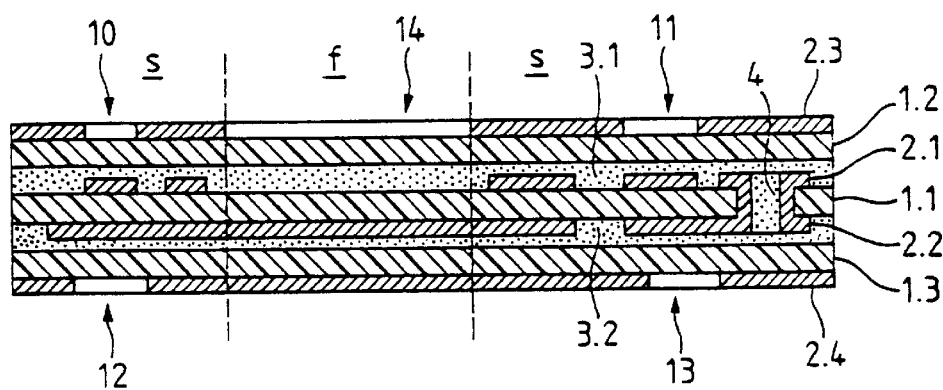
FIGS. 2a to 2c are sectional side elevations of three stages in the production of a first embodiment of the insulating foil circuit board according to the invention, the rigid areas having three and the flexible area two foil layers.

FIG. 2a shows the insulating foil circuit board after the laminating on of the outer foil layers 1.2 and 1.3 with adhesive coatings 3.1 and 3.2 on the central insulating foil layer 1.1, provided in the preceding method steps with a two-sided conductor pattern 2.1, 2.2 and with plated-through holes 4. The metal coatings 2.3, 2.4 of the outer insulating foil layers 1.2, 1.3 are already etched away at points 10, 11, 12 and 13 for plated through holes and in the central area at point 14 of the flexible area f provided.

Figure 2B:
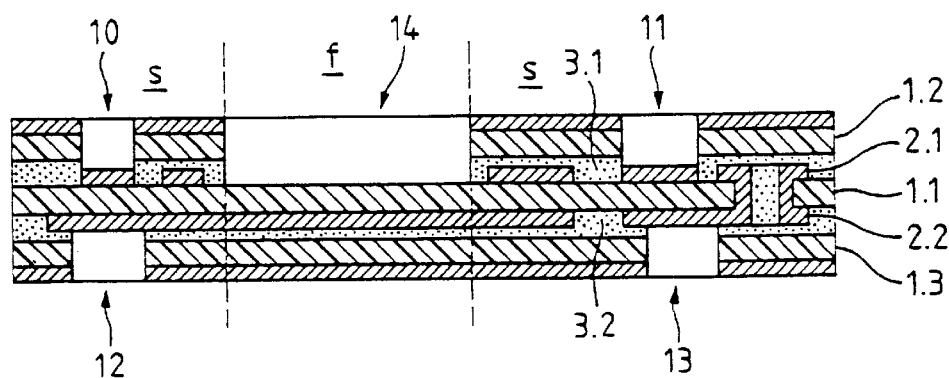

FIG. 2b shows the circuit board of FIG. 2a following a plasma etching stage, in which the points 10 to 14 of the plastic film not covered with metal have been removed. Thus, at points 10 to 13 blind holes have been obtained up to the conductors of the conductor layers 2.1 or 2.2, while at point 14 there is a larger-surface opening in the insulating foil layer 1.2, the adhesive coating 3.1 also having been removed.

The etching parameters for the plasma etching of the described stage must be set in such a way that the blind holes are etched sufficiently deep, but without any undesired undercutting. In the same etching stage, i.e. with the same etching parameters, in the flexible area f the plastic film 1.2 and the adhesive coating 3.1 are etched away. Thus, the requirements with regards to etching at points 10 to 13 are not precisely the same as the requirements regarding etching at the point 14. However, etching in one stage is still possible, if e.g. use is made of polyimide films and polyimide adhesive coatings, the adhesive coating being either uncured or not completely cured prior to plasma etching. As a result the adhesive coating offers a considerably reduced resistance to the etching and is very rapidly etched away, so that the deeper etching process at point 14 does not lead to an undesired undercutting at points 10 to 13. However, it can also be acceptable, as a function of the particular use, if adhesive coating residues are left behind at point 14.

Figure 2C:
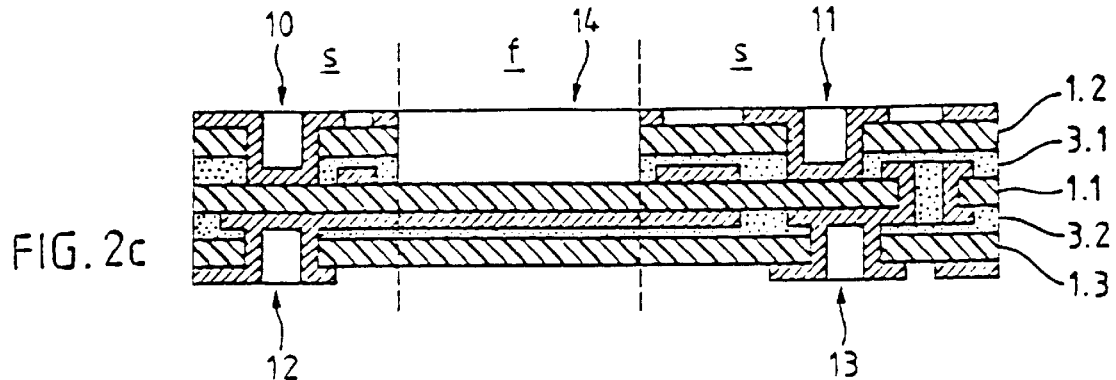

FIG. 2c shows the same finished circuit board area after the plating through of the blind holes at points 10 to 13 and the photochemical production of the conductor pattern on the two surfaces of the circuit board. As can be gathered from the drawing, in its rigid areas s the finished circuit has three (1.1, 1.2, 1.3) non-conductive foil layers (four conductor layers) and in its flexible area two (1.1, 1.3) insulating foil layers (e.g. one conductor layer).

FIGS. 3a to 3d show a further method for the production of foil circuit boards according to the invention and flexible areas can be produced with a continuous transition to the rigid areas. The method differs from that described in conjunction with FIGS. 2a to 2c in that the etching stage for producing the flexible areas is not the same as the etching stage for producing the blind holes. This obviates the need for the same etching parameters, which leads to much greater freedom, but the method is more complicated.

Figure 3A:
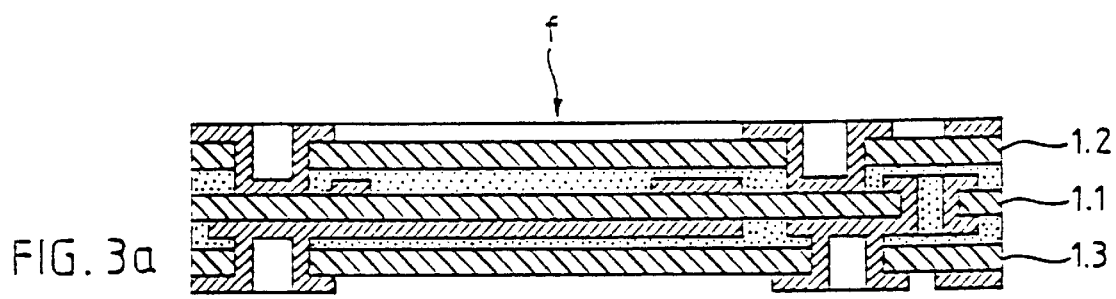
FIGS. 3a to 3d are sectional side elevations of four stages in the production of a second embodiment of the insulating foil circuit board according to the invention, the rigid areas having three and the flexible area two insulating foil layers and there is a continuous transition between the rigid and flexible areas.
Figure 3B:
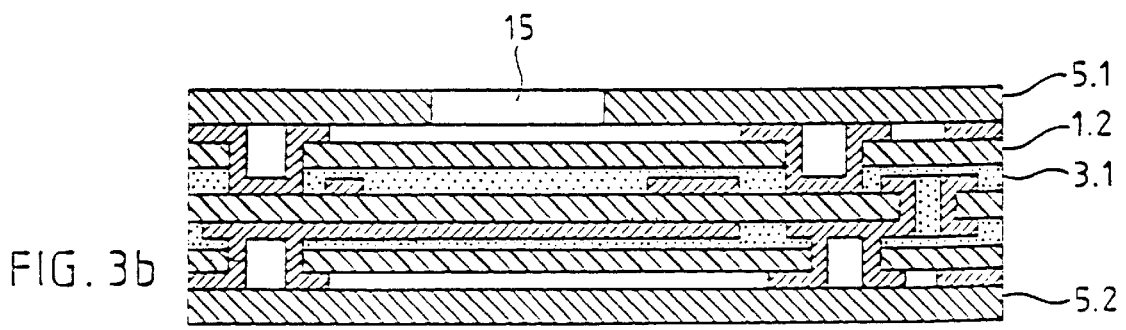

FIG. 3a shows a insulating foil circuit board with three non-conductive foil layers 1.1, 1.2 and 1.3 (four circuit board layers), whose conductor pattern on the two surfaces with the blind holes to the lower lying conductors is already produced. In the central area to be transformed into a flexible area f, the circuit board only has internal conductors. As shown in FIG. 3b, onto both sides of this foil circuit board is pressed a metal mask 5.1 and 5.2 (e.g. of high-grade steel), which in the flexible area f e.g. has recesses 15 on one side.

Figure 3C:
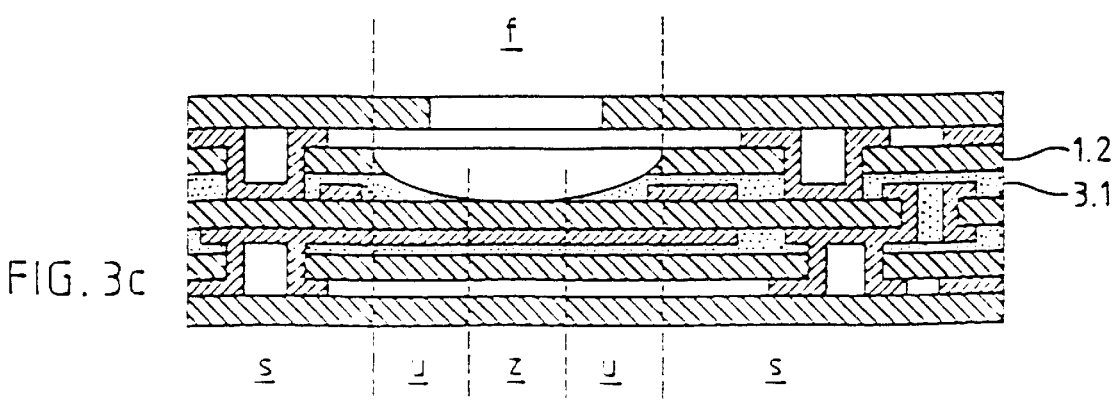

If the circuit board provided with the pressed on mask now undergoes a further plasma etching stage, e.g. the circuit board according to FIG. 3c is obtained in which in the flexible area f, the plastic film accessible through the metal mask has been attacked. As a function of the chosen etching parameters and the spacing between the mask and the substrate, it is possible to obtain under-cuttings, as shown in FIG. 3c, so that from marginal areas u of the flexible area f, where the removal is less, the thickness of the insulating foil layer 2.1 and adhesive coating 3.1 successively decreases towards a central area z.

Figure 3D:
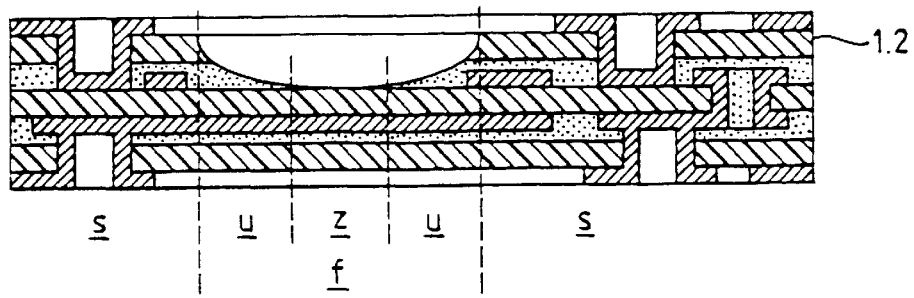

FIG. 3d shows the finished foil circuit board with the continuous transition between the flexible area f and the rigid areas s. It is conceivable to laminate further insulating foil layers onto the circuit board and they are once again etched away in the flexible areas f, e.g. according to the method described in conjunction with FIGS. 2a to 2c.

Figure 4:
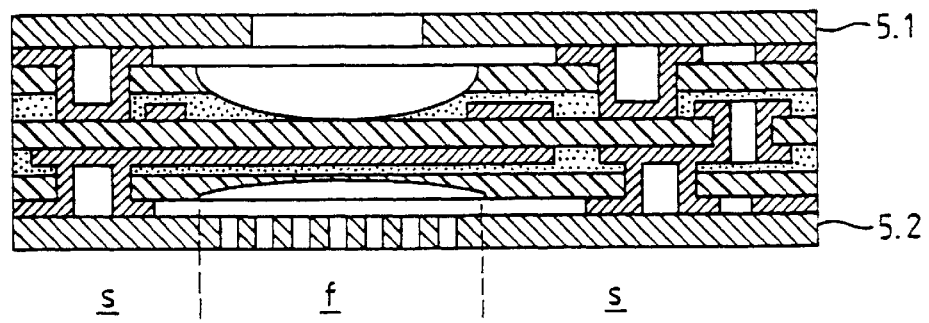
FIG. 4 is a sectional side elevation of a further embodiment of the insulating foil circuit board according to the invention with a continuous area transition.

FIG. 4 shows another embodiment of the foil circuit board according to the invention. The production stage is the same as shown in FIG. 3c. Onto the circuit board already complete with the exception of the flexible areas f, are pressed on both sides metal masks 5.1 and 5.2 with openings in the flexible areas and then the circuit board is subjected to a plasma etching stage. The removal of the insulating foil material by the etching stage is, as stated, dependent on the etching parameters and shapes and arrangements of the openings in the mask. This can be clearly gathered from a comparison of the removal or etching away at the top and bottom in FIG. 4. At the top is shown the undercutting of FIG. 3c, which occurs through a single mask opening. At the bottom, to reduce removal, there is a series of smaller openings instead of a single opening in the mask. Therefore the etching rate can be reduced for constant etching parameters, which is advantageous on the underside, because with higher etching rates the conductors would be exposed, which is not necessarily desired in the flexible area.

FIGS. 5a to 5d illustrate a method with which similar flexible areas can be produced to those of the method according to FIGS. 3 and 4, but in which no special etching stage is required for the flexible areas f, i.e. where the flexible areas with the blind holes are produced with the etching parameters resulting from the latter.

Figure 5A:
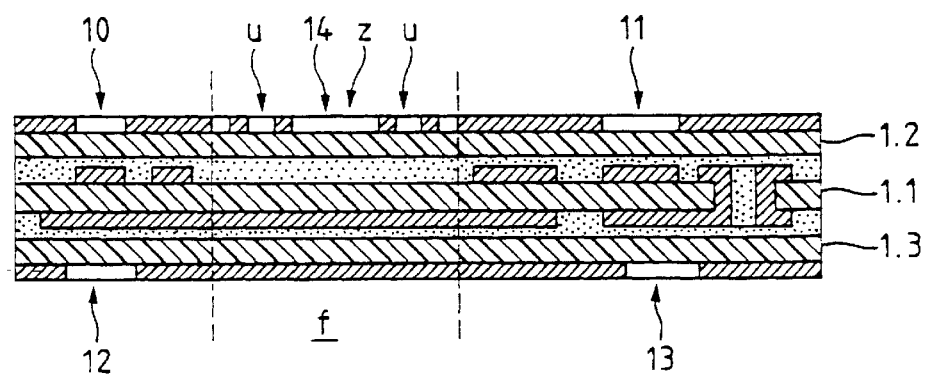
FIGS. 5a to 5d are sectional side elevations of four stages in the production of a further embodiment of the foil circuit board according to the invention, the flexible area having reduced thickness foil layers and the area transition is continuous.

FIG. 5a shows a insulating foil circuit board with three non-conductive foil layers 1.1, 1.2 and 1.3. The metal coatings of the outer foil layers have already been etched away at points 10 to 13 for blind holes and at point 14 for the flexible area f. At point 14 there is an opening pattern, which e.g. has larger openings in the center z of the area and smaller openings towards its edge u.

Figure 5B:
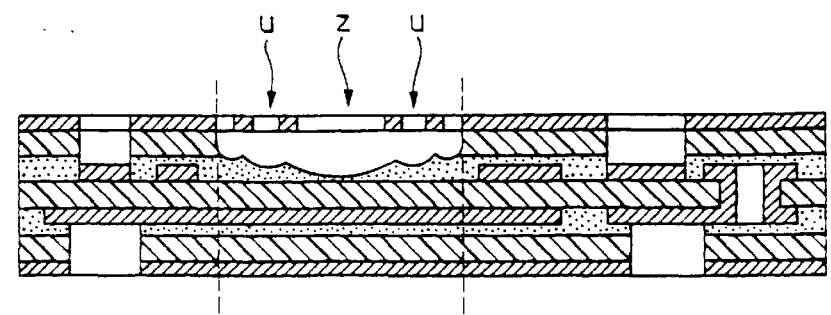

FIG. 5b shows the same circuit board after plasma etching. It is clear that the opening size determines the etching rate and consequently the latter is greater in the center z of the flexible area than in its marginal areas u. This also permits the production of a flexible area with a continuous transition to the rigid area.

Figure 5C:
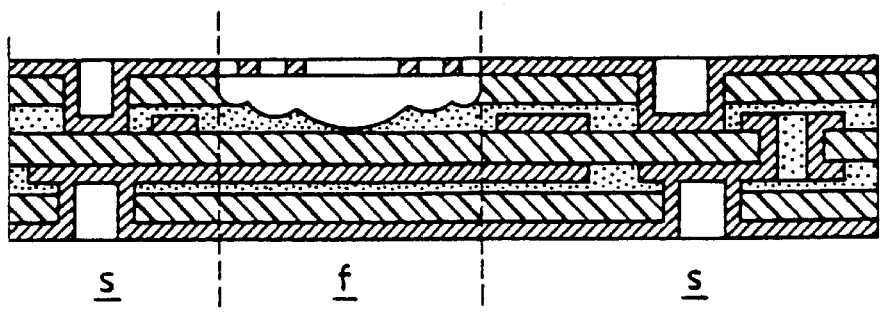
Figure 5D:
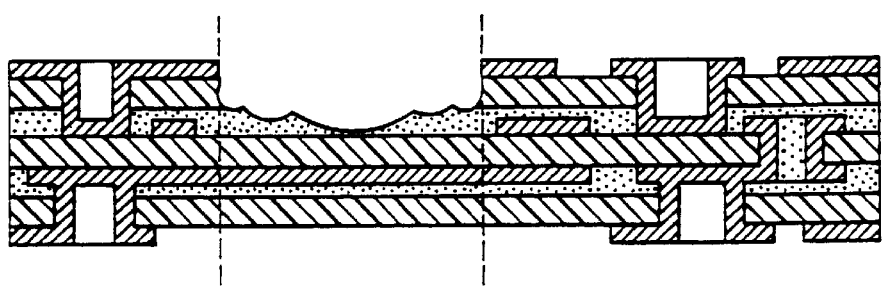

FIGS. 5c and 5d show the production of the circuit board by electroplating build-up of the metal coating and plating through the blind holes and by photochemical production of the outermost conductor pattern, the metal coating covering the flexible area f in sieve-like manner having been etched away.

It is obvious that in all the described cases the flexible area could also have been formed by weakening or complete removal of both outer foil layers. It is also obvious that flexible areas could be produced on foil circuit boards with more than three insulating foil layers, one or both of the outermost insulating foil layers being weakened or interrupted or additionally also the next inner insulating foil layer or layers.

In the same way the method according to the invention can be applied to foil circuit boards, whose outer layers have been produced by laminating on a metal coating with the aid of an adhesive film, in such a way that the plastic coating is only in one-layer and not two-layer form between the corresponding conductor layers.

What is claimed is:

1. A foil circuit board comprising:
   a plurality of flexible electrically non-conductive and flexible electrically conductive layers, said plurality of electrically non-conductive and electrically conductive layers being laminated together to form a generally rigid circuit board, said non-conductive layers being positioned between said conductive layers, said board including flexible conductive layers as outermost surface layers;
   a plurality of through-holes etched through said non-conductive layers; and
   at least one flexible area in said circuit board comprising a selected region wherein at least one of said outermost surface layers and an adjacent:, underlying non-conductive layer are partly removed by etching.

2. A circuit board according to claim 1 wherein said board comprises rigid areas having three of said flexible non-conductive layers alternating with four of said flexible conductive layers, and wherein said at least one flexible area comprises two of said nonconductive layers and an intermediate one of said conductive layers.

3. A circuit board comprising:
   a plurality of flexible electrically non-conductive and flexible electrically conductive layers laminated together to form a generally rigid circuit board, said non-conductive layers being positioned between said conductive layers, said board including flexible conductive layers as outermost surface layers;
   a plurality of through-holes etched through said non-conductive layers; and
   at least one flexible area in said circuit board comprising a selected region wherein an outer one of said conductive layers and an adjacent, underlying non-conductive layer are partly removed by etching, said at least one flexible area including an adhesive layer connecting an outermost one of said non-conductive layers to an adjacent, underlying conductive layer, and wherein said removal includes removal of a portion of said adhesive layer.

4. A circuit board according to claim 3 wherein said outermost one of said non-conductive layers and said adhesive layer have thicknesses in said at least one flexible area substantially continuously decreasing from marginal portions of said at least one flexible area to the center thereof.

* * * * *

UNITED STATES PATENT AND TRADEMARK OFFICE
CERTIFICATE OF CORRECTION

PATENT NO.   : 6,162,996
DATED        : December 19, 2000
INVENTOR(S)  : Schmidt et al.

It is certified that error appears in the above-identified patent and that said Letters Patent is hereby corrected as shown below:

On the Title Page, Section 57, ABSTRACT, Line 1, delete "The" and insert --A--.

On the Title Page, Section 57, ABSTRACT, Line 1, delete "according to the invention".

On the Title Page, Section 57, ABSTRACT, Line 6, after "etching" insert --or its thickness is reduced--.

Column 1, Line 17, after "a" insert --non-conductive--.

Column 1, Line 28, after "and" insert --,-- (comma).

Column 1, Line 36, delete "ever" and insert --even--.

Column 3, Line 32, delete "plated through" and insert --plated-through--.

Column 3, Line 65, after "non-conductive" insert --insulating--.

Column 3, Line 66, after "(1.1, 1.3)" insert --non-conductive--.

Column 4, Line 11, after "non-conductive" insert --insulating--.

Signed and Sealed this

Twenty-ninth Day of May, 2001

*Attest:*

NICHOLAS P. GODICI

*Attesting Officer*    Acting Director of the United States Patent and Trademark Office